(12) United States Patent
Seo et al.

(10) Patent No.: US 10,854,296 B2
(45) Date of Patent: Dec. 1, 2020

(54) SEMICONDUCTOR DEVICE AND PROGRAMMING METHOD OF THE SEMICONDUCTOR DEVICE

(71) Applicant: SK hynix Inc., Icheon-si (KR)

(72) Inventors: Ji Hyun Seo, Seoul (KR); Bong Yeol Park, Cheongju-si (KR); Hee Youl Lee, Icheon-si (KR); Han Soo Joo, Daejeon (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/502,392

(22) Filed: Jul. 3, 2019

(65) Prior Publication Data

US 2020/0168280 A1 May 28, 2020

(30) Foreign Application Priority Data

Nov. 23, 2018 (KR) .................. 10-2018-0146802

(51) Int. Cl.
*G11C 16/04* (2006.01)
*G11C 16/10* (2006.01)
*G11C 16/34* (2006.01)
*G11C 16/08* (2006.01)
*G11C 11/56* (2006.01)

(52) U.S. Cl.
CPC .......... *G11C 16/10* (2013.01); *G11C 16/0483* (2013.01); *G11C 16/08* (2013.01); *G11C 16/3427* (2013.01); *G11C 11/5671* (2013.01)

(58) Field of Classification Search
CPC ...................................................... G11C 16/10
USPC ..................................................... 365/185.28
See application file for complete search history.

(56) References Cited

U.S. PATENT DOCUMENTS

| | | | |
|---|---|---|---|
| 7,924,618 B2 * | 4/2011 | Lee ..................... | G11C 11/5628 365/185.18 |
| 9,030,879 B2 | 5/2015 | Rhie | |
| 9,286,987 B1 | 3/2016 | Dong et al. | |
| 2009/0237993 A1 * | 9/2009 | Yanagidaira ........ | G11C 11/5628 365/185.03 |
| 2013/0314987 A1 * | 11/2013 | Hemink ............. | G11C 16/3427 365/185.02 |
| 2017/0062059 A1 * | 3/2017 | Kim ...................... | G11C 16/14 |

* cited by examiner

*Primary Examiner* — Hoai V Ho
(74) *Attorney, Agent, or Firm* — William Park & Associates Ltd.

(57) ABSTRACT

A semiconductor device includes strings each having a plurality of memory cells. The strings are coupled between a common source line and a bit line. A method of operating the semiconductor device includes applying a pre-program voltage to a selected word line coupled to a selected memory cell and to an unselected word line coupled to an unselected memory cell adjacent to the selected memory cell among the plurality of memory cells. The method further includes applying a first program voltage to the selected word line.

20 Claims, 13 Drawing Sheets

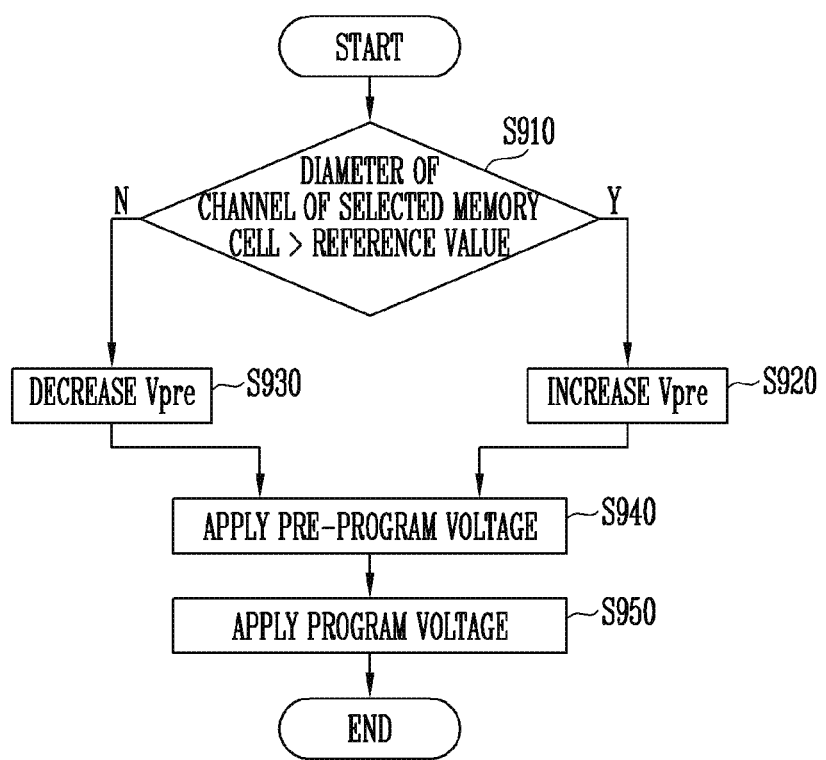

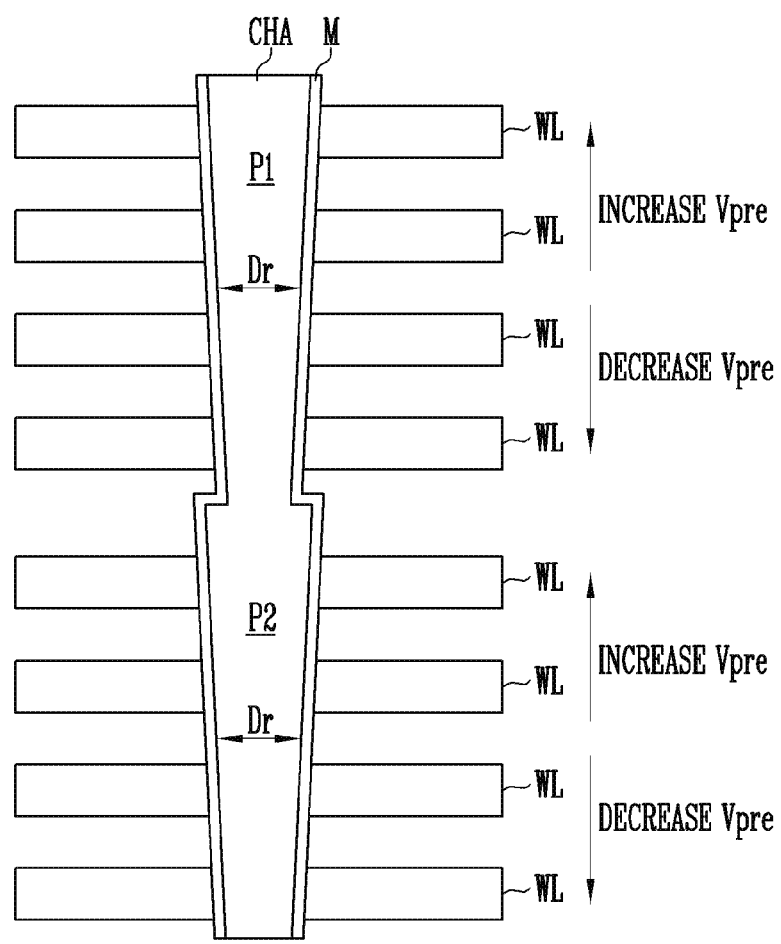

SEMICONDUCTOR DEVICE AND PROGRAMMING METHOD OF THE SEMICONDUCTOR DEVICE

CROSS-REFERENCE TO RELATED APPLICATION

The present application claims priority under 35 U.S.C. § 119(a) to Korean patent application number 10-2018-0146802, filed on Nov. 23, 2018, in the Korean Intellectual Property Office, the entire disclosure of which is incorporated herein by reference.

BACKGROUND

1. Technical Field

Various embodiments of the present disclosure generally relate to an electronic device, and more particularly, to a semiconductor device and a method of operating the semiconductor device.

2. Related Art

Semiconductor memory devices are storage devices made of semiconductor materials, such as silicon (Si), germanium (Ge), gallium arsenide (GaAs), and indium phosphide (InP). Semiconductor memory devices are classified into volatile memory devices and nonvolatile memory devices.

Volatile memory devices lose stored data when the power is off. Examples of volatile memory devices may include Static RAM (SRAM), Dynamic RAM (DRAM), Synchronous DRAM (SDRAM), and the like. Nonvolatile memory devices may retain stored data independent of the availability of power. Examples of nonvolatile memory devices may include Read Only Memory (ROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RRAM), Ferroelectric RAM (FRAM), and the like. Flash memory may be generally classified into NOR-type memory and NAND-type memory.

SUMMARY

Various embodiments are directed to a semiconductor device with improved operational characteristics and to an operating method of the semiconductor device.

According to an embodiment, a semiconductor device may include a string including a plurality of memory cells, wherein the string is coupled between a common source line and a bit line. A method of operating the semiconductor device may include applying a pre-program voltage to a selected word line coupled to a selected memory cell and to an unselected word line coupled to an unselected memory cell adjacent to the selected memory cell among the plurality of memory cells. The method may further include applying a first program voltage to the selected word line.

According to an embodiment, a semiconductor device may include a memory string coupled between a common source line and a bit line, wherein the memory string includes a plurality of memory cells. The semiconductor device may also include a plurality of word lines coupled to the plurality of memory cells, respectively. The semiconductor device may further include a control logic configured to apply a pre-program voltage to a selected word line and an unselected word line adjacent to the selected word line and then apply a program voltage to the selected word line among the plurality of word lines.

According to an embodiment, a semiconductor device may include stacked word lines, a channel layer passing through the stacked word lines, and a memory layer enclosing the channel layer, wherein the semiconductor device is configured to apply a pre-program voltage to a selected word line and an unselected word line adjacent to the selected word line and then to apply a program voltage to the selected word line.

BRIEF DESCRIPTION OF THE DRAWINGS

FIG. 9 is a flowchart illustrating a method of operating a semiconductor device, according to an embodiment;

FIGS. 10A, 10B, and 10C are mimetic diagrams illustrating a method of adjusting a pre-program voltage, according to an embodiment;

DETAILED DESCRIPTION

Hereinafter, various examples of embodiments are described with reference to the accompanying drawings. In the following description, a detailed explanation of related functions and constitutions may be omitted for simplicity and conciseness. In addition, other embodiments may take different forms so the present teachings should not be construed as being limited to the embodiments set forth herein. Rather, the presented embodiments are provided so that this disclosure will be enabling those skilled in the art.

It is also noted that in this specification, "connected/coupled" refers to one component not only directly coupling another component but also indirectly coupling another component through an intermediate component. In the specification, when an element is referred to as "comprising" or "including" a component, it does not exclude other components but may further include other components unless a description to the contrary is specifically pointed out in context.

Figure 1:
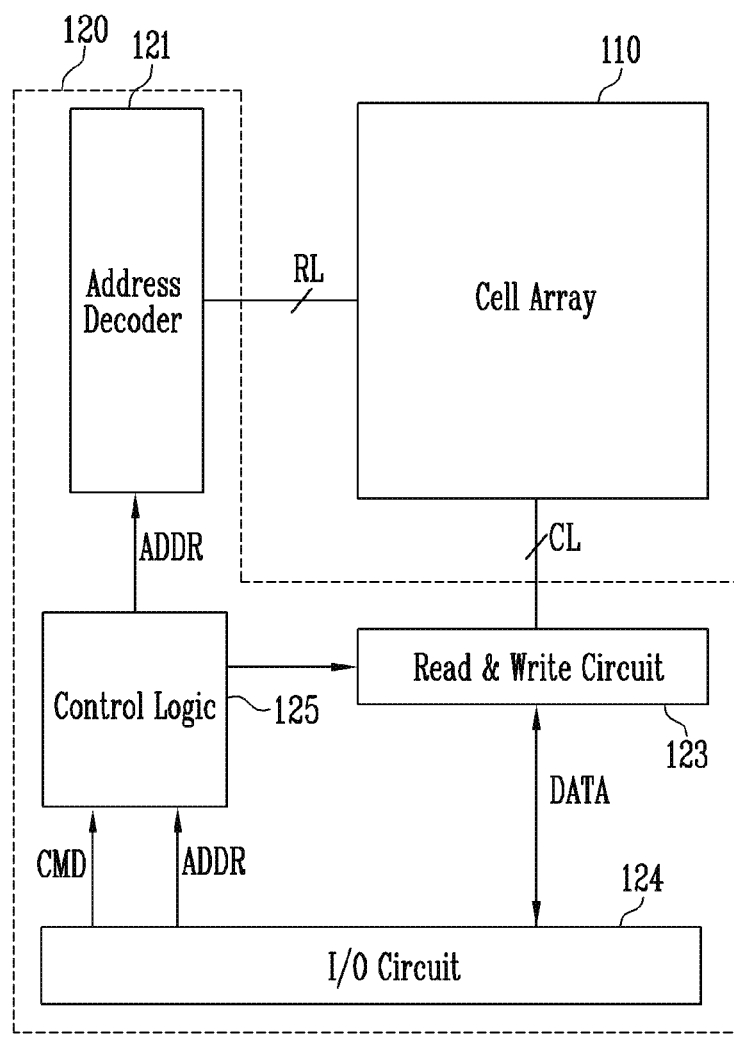
FIG. 1 is a block diagram illustrating the configuration of a semiconductor device, according to an embodiment.

FIG. 1 is a block diagram illustrating the configuration of a semiconductor device 100, according to an embodiment. Referring to FIG. 1, the semiconductor device 100 may include a cell array 110 and a peripheral circuit 120. The semiconductor device 100 may be a memory device, for example, a nonvolatile memory device. For example, the semiconductor device 100 may be a flash memory device.

The cell array 110 may be coupled to an address decoder 121 through row lines RL and to a read and write circuit 123 through column lines CL. The row lines RL may be word lines and the column lines CL may be bit lines. However, the terms "word lines" and "bit lines" may be relative to each other. In other words, the row lines may be the bit lines, and the column lines may be the word lines.

The cell array 110 may include a plurality of memory strings, and the memory strings may be arranged in a horizontal direction or a vertical direction relative to a substrate. In addition, the cell array 110 may include a plurality of memory blocks, and each of the plurality of memory blocks may include a plurality of pages. For example, the semiconductor device 100 may perform an erase operation in units of memory blocks and a program operation or a read operation in units of pages.

The peripheral circuit 120 may include the address decoder 121, the read and write circuit 123, an input/output circuit 124, and a control logic 125.

The control logic 125 may be coupled to the address decoder 121, the read and write circuit 123, and the input/output circuit 124. The control logic 125 may receive a command CMD and an address ADDR from the input/output circuit 124 and control the address decoder 121 and the read and write circuit 123 to perform an internal operation in response to the received command CMD.

The address decoder 121 may be coupled to the cell array 110 through the row lines RL. For example, the address decoder 121 may be coupled to the cell array 110 through the word line, a dummy word line, a source select line, and a drain select line. In addition, the address decoder 121 may be controlled by the control logic 125 and configured to control the row lines RL. Therefore, the address decoder 121 may receive the address ADDR from the control logic 125 and select one of the memory blocks of the cell array 110 in response to the received address ADDR.

A program operation and a read operation of the semiconductor device 100 may be performed in units of pages. Therefore, during the program operation and the read operation, the address ADDR may include a block address and a row address. The address decoder 121 may decode the block address included in the received address ADDR and select one of the memory blocks according to the decoded block address. The address decoder 121 may decode the row address included in the received address ADDR and select one of the pages of the selected memory block in response to the decoded row address.

An erase operation of the semiconductor device 100 may be performed in units of memory blocks. Therefore, during the erase operation, the address ADDR may include a block address. The address decoder 121 may decode the block address, and select one of the memory blocks in response to the decoded block address.

The read and write circuit 123 may be coupled to the cell array 110 through the column lines CL. During a program operation, the read and write circuit 123 may transfer data DATA received from the input/output circuit 124 to the column lines CL, and memory cells of the selected page may be programmed with the transferred data DATA. The data DATA may be multi-bit data to be programmed to memory cells, respectively. During a read operation, the read and write circuit 123 may read the data DATA from the memory cells of the selected page through the column lines CL and output the read data DATA to the input/output circuit 124. During an erase operation, the read and write circuit 123 may float the column lines CL. A program operation and an erase operation may include a verify operation, and the verify operation may be similarly performed to the read operation.

According to the configuration as described above, the memory cells may be programmed by a Single Level Cell (SLC) method or a Multi Level Cell (MLC) method. In addition, the control logic 125 may control the semiconductor device 100 to perform a program operation by a one-shot method or a multi-step method. The multi-step method may perform a program operation a plurality of times to configure a desired program state, and may be a pre-/main program method, a reprogram method, a shadow program method, and the like. After configuring a desired program state by a one-shot method, a reprogram may be further performed to decrease a width of a threshold voltage distribution.

The control logic 125 may control the address decoder 121 and the read and write circuit 123 to perform a program operation after removing a hole of a space region by a pre-program operation. In other words, the control logic 125 may control the address decoder 121 and the read and write circuit 123 to apply a program voltage to a selected word line after applying a pre-program voltage to the selected word line and an unselected word line adjacent to the selected word line. For example, the peripheral circuit 120 may apply a pre-program voltage to a selected word line and unselected word lines located at both sides of the selected word line. In another example, the peripheral circuit 120 may apply a pre-program voltage to a selected word line and an unselected word line located at one side of the selected word line.

According to this control method, a hole present at a space region between the selected word line and the unselected word line may be removed by a fringe field. Accordingly, a charge loss by lateral spreading may be minimized and data retention characteristics may be improved.

Figure 2:
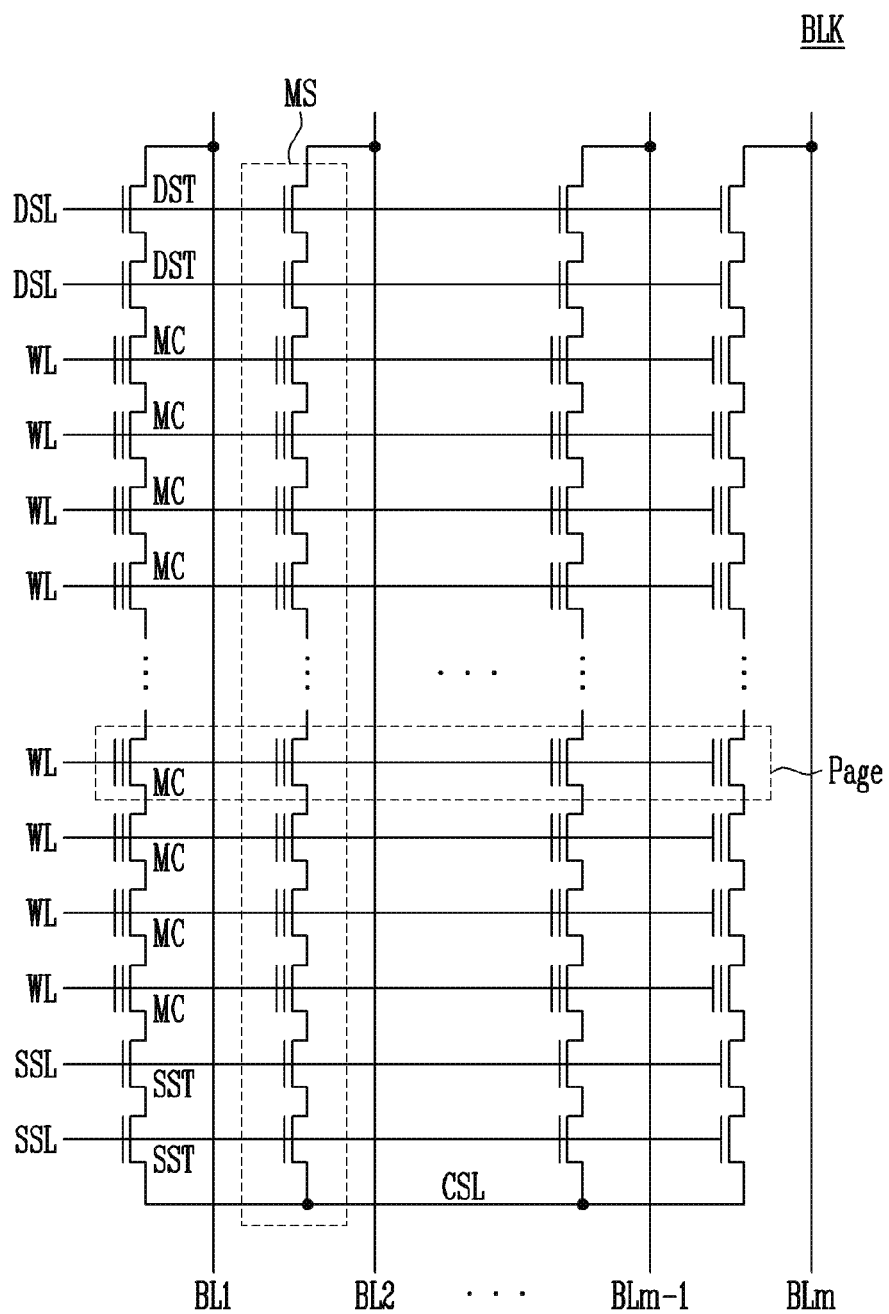
FIGS. 2, 3, and 4 are circuit diagrams illustrating a cell array structure of a semiconductor device, according to an embodiment.
Figure 3:
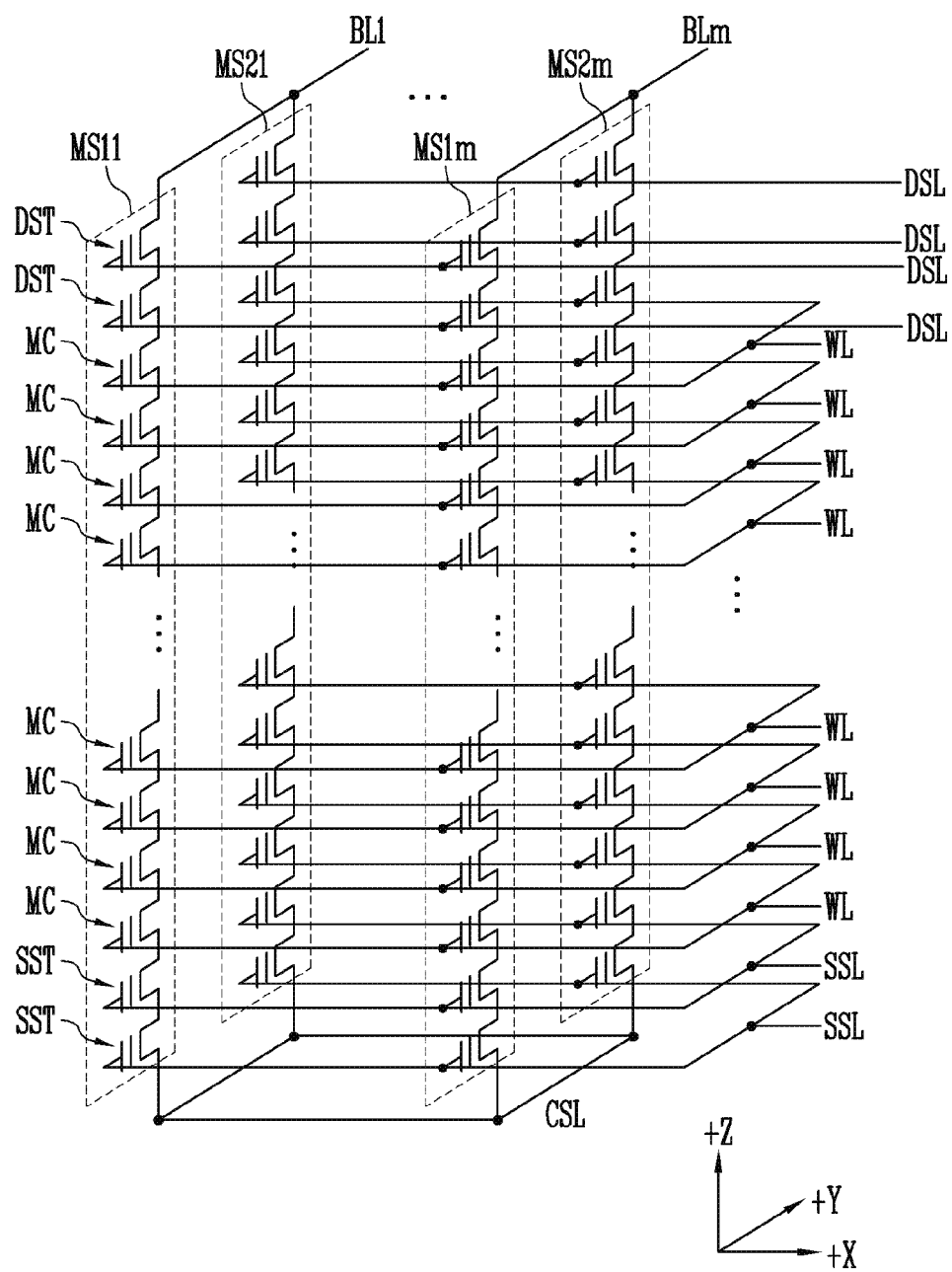
Figure 4:
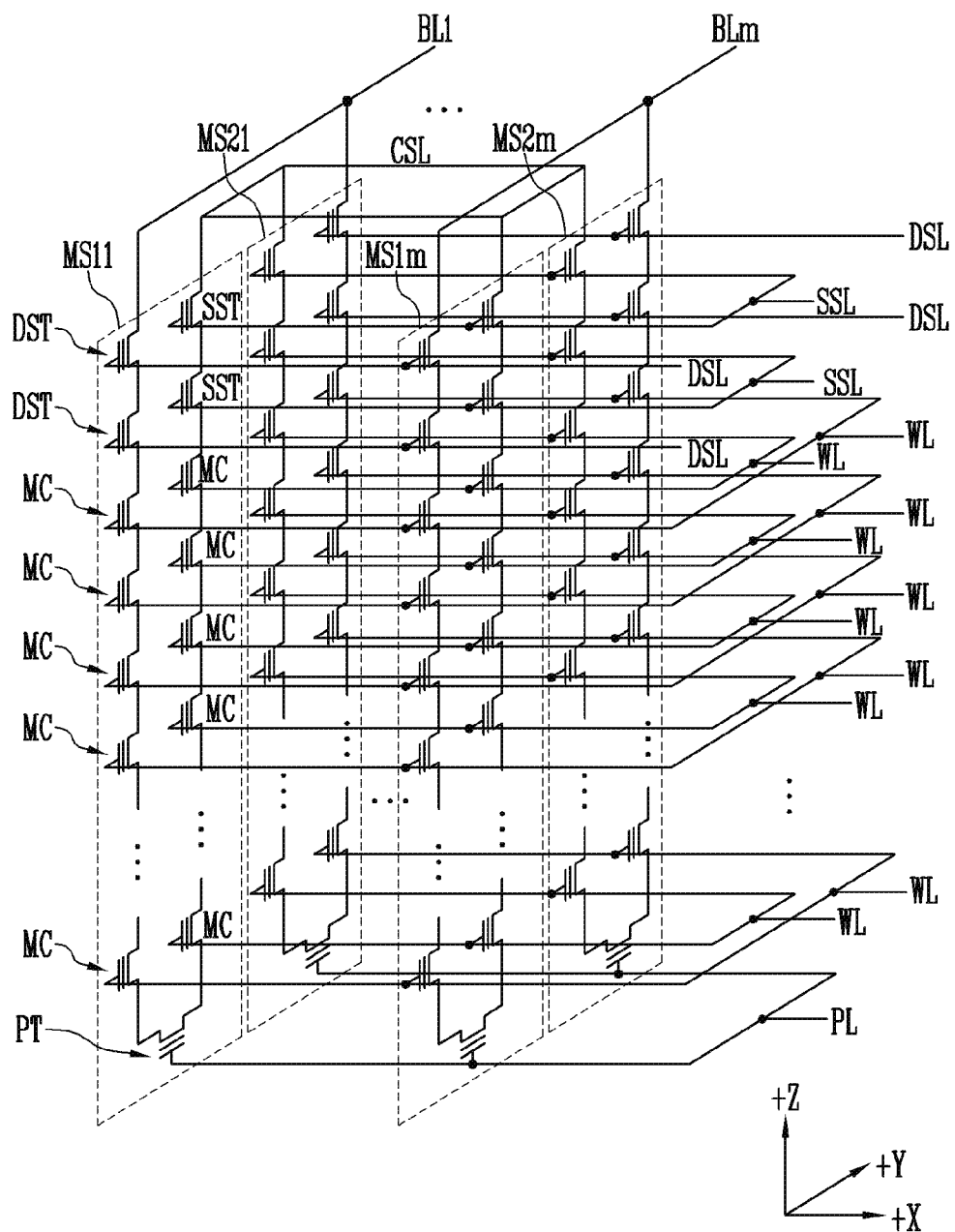

FIGS. 2 to 4 are circuit diagrams illustrating a cell array structure of a semiconductor device according to different embodiments.

Referring to FIG. 2, the cell array may include a plurality of memory blocks BLK, and each of the memory blocks BLK may include a plurality of memory strings MS. In addition, the plurality of memory strings MS may be coupled between bit lines BL1 to BLm and a common source line CSL.

Each of the memory strings MS may include at least one drain select transistor DST, a plurality of memory cells MC, and at least one source select transistor SST coupled in series with each other. Here, m may be an integer of 2 or more. Although not illustrated in FIG. 2, each of the memory strings MS may further include a dummy memory cell located between the source select transistor SST and the memory cells MC or between the drain select transistor DST and the memory cells MC. In addition, the memory cells MC included in a single memory string MS may be located in substantially the same level or in different levels.

Gate electrodes of the memory cells MC may be coupled to word lines WL. Word line voltages (such as a program voltage, a pass voltage, and a read voltage) necessary for drive may be applied to each of the word lines WL. Gate electrodes of the drain select transistors DST may be coupled to a drain select line DSL. Gate electrodes of the source select transistors SST may be coupled to a source select line SSL.

Each of the memory cells MC may include a channel layer, a memory layer, and a gate electrode. The memory layer may be to store data, and include a tunnel insulating layer, a data storage layer, and a charge blocking layer.

When each of the memory strings MS includes a dummy memory cell, the dummy memory cell may have the substantially same structure as the memory cells MC and include a memory layer.

Each of the source and drain select transistors SST and DST may include a channel layer, a gate insulating layer, and a gate electrode. In addition, each of the source and drain select transistors SST and DST may have the substantially same structure as the memory cells, and include a memory layer instead of a gate insulating layer. In other words, each of the source and drain select transistors SST and DST may include a channel layer, a memory layer, and a gate electrode, and use the memory layer as a gate insulating layer.

According to the structure as described above, the memory cells MC coupled to the same word line WL and simultaneously programmed may constitute one page Page, and one memory block BLK may include a plurality of pages Page.

Referring to FIG. 3, a memory block BLK according to another embodiment may include a plurality of memory strings MS11 to MS1$m$ and MS21 to MS2$m$ coupled between the bit lines BL1 to BLm and the common source line CSL. Each of the memory strings MS11 to MS1$m$ and MS21 to MS2$m$ may extend in a +Z direction. Here, the +Z direction may be a direction in which the memory cells MC are stacked. Here, m may be an integer of 2 or more.

Each of the memory strings MS11 to MS1$m$ and MS21 to MS2$m$ may include at least one source select transistor SST, the plurality of memory cells MC, and at least one drain select transistor DST that are sequentially stacked on each other.

The source select transistors SST included in a single memory string among the memory strings MS11 to MS1$m$ and MS21 to MS2$m$ may be coupled between the memory cells MC and the common source line CSL in series. In addition, the source select transistors SST in the same level may be coupled to the same source select line SSL.

The memory cells MC included in a single memory string among the memory strings MS11 to MS1$m$ and MS21 to MS2$m$ may be coupled between the source select transistor SST and the drain select transistor DST in series. In addition, the memory cells MC in the same level may be coupled to the same word line WL.

The drain select transistors DST included in a single memory string among the memory strings MS11 to MS1$m$ and MS21 to MS2$m$ may be coupled between the bit lines BL1 to BLm and the memory cells MC in series. The drain select transistors DST in the same level among the drain select transistors DST of the memory strings MS11 to MS1$m$ and MS21 to MS2$m$ arranged in the same row (in a +X direction) may be coupled to the same drain select line DSL. In addition, the drain select transistors DST arranged in different rows (in the +X direction) may be coupled to different drain select lines DSL from each other.

Referring to FIG. 4, a memory block BLK according to another embodiment may include the plurality of memory strings MS11 to MS1$m$ and MS21 to MS2$m$. Each of the memory strings MS11 to MS1$m$ and MS21 to MS2$m$ may include at least one source select transistor SST, a plurality of source-side memory cells MC, at least one pipe transistor PT, an additional plurality of drain-side memory cells MC, and at least one drain select transistor DST coupled to each other in series. Each of the memory strings MS11 to MS1$m$ and MS21 to MS2$m$ may be arranged in a "U" shape.

The pipe transistor PT may couple the drain-side memory cells MC and the source-side memory cells MC. In addition, a gate of the pipe transistor PT of each of the memory strings MS11 to MS1$m$ and MS21 to MS2$m$ may be coupled to a pipe line PL. Structures other than the structures described above with reference to FIG. 4 are similar to the structures as described with reference to FIG. 3. Therefore, repetitive descriptions are omitted here.

Figure 5:
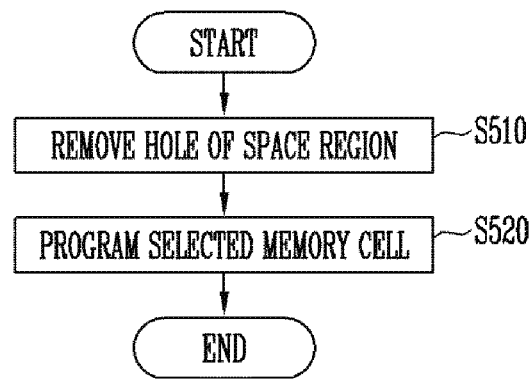
FIG. 5 is a flowchart illustrating a method of operating a semiconductor device, according to an embodiment.

FIG. 5 is a flowchart illustrating a method of operating a semiconductor device, according to an embodiment. The semiconductor device may include the cell array described above with reference to FIGS. 2, 3, and 4. For example, the memory strings MS may be coupled between the common source line CSL and the bit line BL, and each of the memory strings MS may include the plurality of memory cells MC.

Referring to FIG. 5, first, a hole present in a space region may be removed at step S510. The space region may be a region between adjacent memory cells or a region between adjacent word lines.

For example, a pre-program voltage may be applied to a selected word line. The pre-program voltage may be applied to a word line adjacent to the selected word line among unselected word lines. In addition, a pass voltage may be applied to the remaining unselected word lines. Here, the "adjacent" word line may include at least one word line located right next to the selected word line or word lines located within a predetermined range from the selected word line. Thereby, a fringe field may be generated between the selected word line and the adjacent unselected word line, and electrons may be injected into the space region by the fringe field. Accordingly, the hole of the space region may be removed.

Subsequently, the selected memory cell MC may be programmed at step S520. For example, a program voltage may be applied to the selected word line WL and a pass voltage may be applied to the unselected word lines WL to perform a program operation.

According to the method described above, retention characteristics of a semiconductor device may be improved because a program operation is performed after removing the hole of the space region.

Figure 6A:
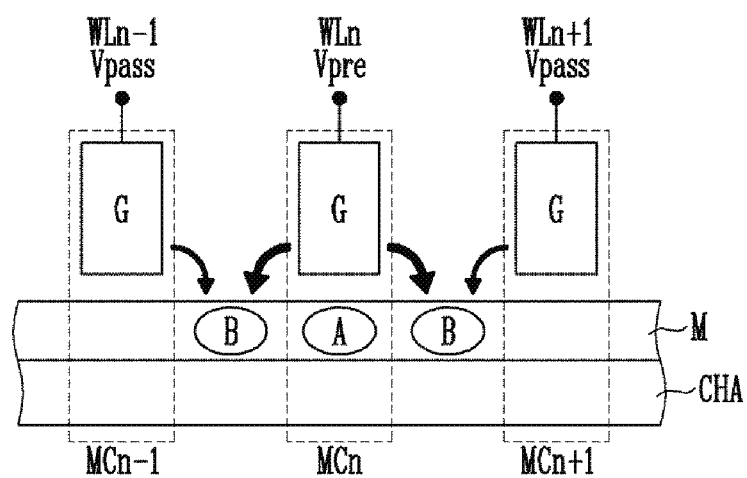
FIGS. 6A, 6B, and 6C are mimetic diagrams illustrating a method of removing a hole, according to an embodiment.
Figure 6B:
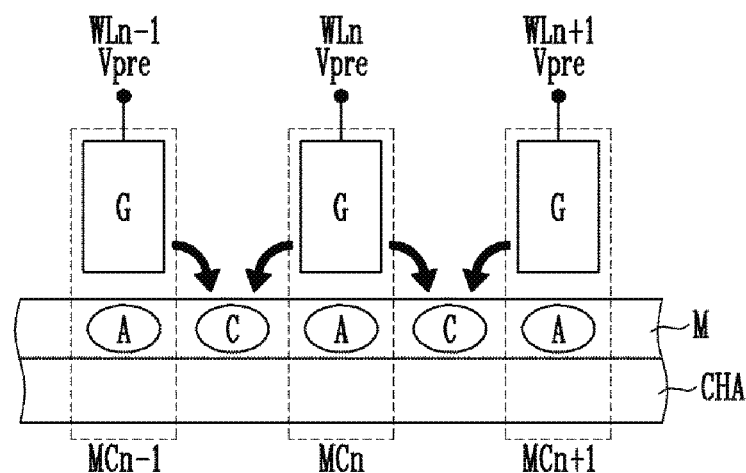
Figure 6C:
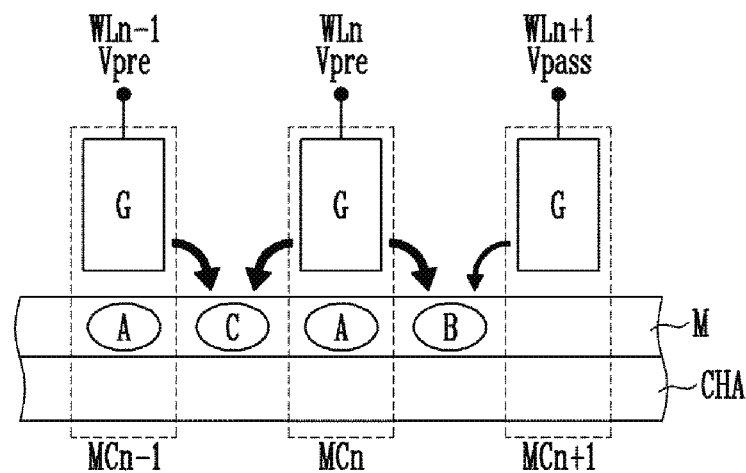

FIGS. 6A to 6C are mimetic diagrams illustrating a method of removing a hole according to an embodiment.

Referring to FIGS. 6A to 6C, each of memory cells MCn−1, MCn, and MCn+1 may include a channel layer CHA, a memory layer M, and a gate electrode G. The memory layer M may be to store data, and include a tunnel insulating layer, a data storage layer, and a charge blocking layer, or at least one of the tunnel insulating layer, the data storage layer, and the charge blocking layer. The data storage layer may include a floating gate, a charge trapping material, polysilicon, a nitride, a variable resistance material, and the like.

The gate electrodes G may be electrically coupled to word lines WLn−1, WLn, and WLn+1, respectively. In addition, the word lines WLn−1, WLn, and WLn+1 may be located in the same level or in different levels from each other.

The adjacent memory cells MC may share a memory layer. For example, the adjacent memory cells MC may share a tunnel insulating layer, a data storage layer, and a charge trapping layer, or at least one of the tunnel insulating layer, the data storage layer, and the charge trapping layer. Accordingly, the memory layer M may include a channel region corresponding to the memory cells MC and a space region located between the adjacent memory cells MC. For example, the memory layer M may include channel regions and space regions that are alternately arranged with each other.

During an erase operation, an erase voltage may be applied to a well region or a hole may be injected into a memory layer by using a gate-induced drain leakage (GIDL) method. However, because a hole is injected not only into a channel region but also into a space region, the hole may remain in the space region after the erase operation is completed. In addition, the hole remaining in the data storage layer of the memory layer M may be a major factor to laterally move charges of the memory cell programmed later. Thereby, a charge loss of the programmed memory cell may be induced. Accordingly, the hole of the space region may be removed by applying the pre-program voltage before the program operation in the embodiment.

Referring to FIG. 6A, when removing a hole, a pre-program voltage Vpre (illustrated in FIGS. 6A, 6B, and 6C as Vpre) may be applied to the selected word line WLn and a pass voltage Vpass may be applied to the unselected word lines WLn−1 and WLn+1. The pass voltage Vpass may have a lower level than the pre-program voltage Vpre. Thereby, electrons may be injected into a channel region A of the selected memory cell MC.

In addition, a weak fringe field may be generated due to the pre-program voltage Vpre applied to the selected word line WLn and the pass voltage Vpass applied to the word lines WLn−1 and WLn+1 adjacent to the selected word line WLn. Thereby, electrons may be injected into spaces B between the selected memory cell MCn and the adjacent memory cells MCn−1 and MCn+1. For example, electrons may be injected into a space region of the memory layer M and the injected electrons may be combined with a hole. The hole of the space region may be injected into the memory layer M during an erase operation.

As described above, the hole of the space region may be removed by performing the pre-program operation before performing the program operation. However, when the pass voltage Vpass is applied to the adjacent word lines WLn−1 and WLn+1, because the fringe field is weak, the hole of the space region might not be sufficiently removed.

Referring to FIG. 6B, the pre-program voltage Vpre may be applied to the selected word line WLn and the word lines WLn−1 and WLn+1 adjacent to the selected word line WLn among the unselected word lines when removing the hole. The pass voltage may be applied to the remaining unselected word lines. Thereby, electrons may be injected into the channel region A of the selected memory cell MCn and the channel regions A of the adjacent memory cells MCn−1 and MCn+1.

In addition, a strong fringe field may be generated due to the pre-program voltage Vpre applied to the selected word line WLn and the adjacent word lines WLn−1 and WLn+1. Thereby, electrons may be sufficiently injected into spaces C between the selected memory cell MCn and the adjacent memory cells MCn−1 and MCn+1. Accordingly, the hole of the space region may be sufficiently removed.

Referring to FIG. 6C, the pre-program voltage Vpre may be applied to the selected word line WLn when removing the hole. In addition, the pre-program voltage Vpre may be applied to at least one word line, for example, the word line WLn−1, among the adjacent word lines WLn−1 and WLn+1. For example, a word line that is coupled to a memory cell on which a program operation is not performed yet or a word line that is coupled to a memory cell having an erase state may be selected among the adjacent word lines WLn−1 and WLn+1 such that the pre-program voltage Vpre is applied to the selected word line. The pass voltage may be applied to the remaining unselected word lines. Thereby, electrons may be injected into the channel region A of the selected memory cell MCn and the channel region A of the adjacent memory cell MCn−1.

A strong fringe field may be generated due to the pre-program voltage Vpre applied to the selected word line WLn and the adjacent word line WLn−1. Thereby, electrons may be sufficiently injected into the space C between the selected memory cell MCn and the adjacent memory cell MCn−1. Accordingly, the hole of the space region may be sufficiently removed. The space B between the memory cell MCn, to which the pre-program voltage Vpre is applied, and the memory cell MCn+1, to which the pass voltage Vpass is applied, is subject to a weak fringe field whereby the hole of the space region might not be sufficiently removed.

Figure 7:
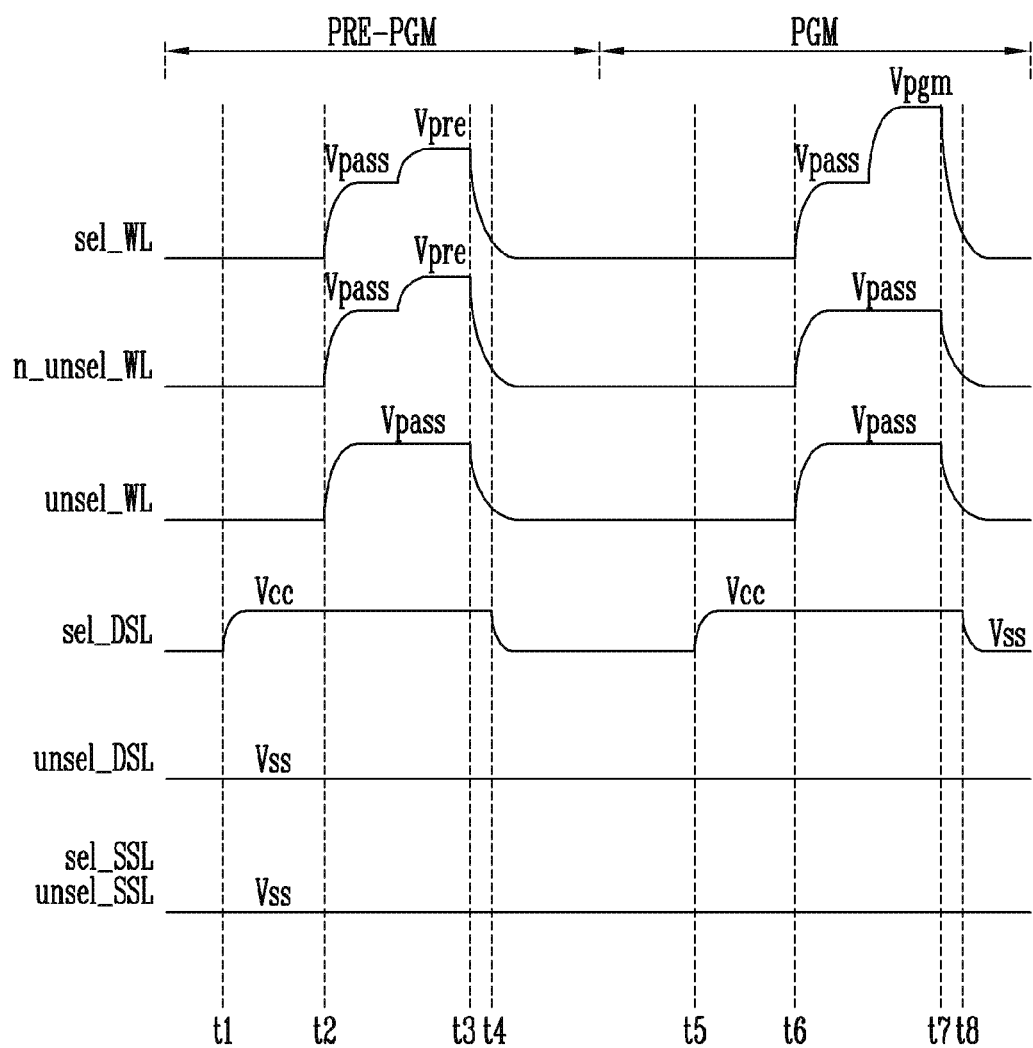
FIG. 7 is a timing diagram illustrating a method of operating a semiconductor device, according to an embodiment.

FIG. 7 is a timing diagram illustrating a method of operating a semiconductor device, according to an embodiment. A program operation PGM may be performed after the hole of the space region is removed by a pre-program operation PRE_PGM. Hereinafter, an operating method is described in detail over time.

At a first time t1, a power voltage Vcc may be applied to a selected drain select line sel_DSL and the drain select transistor DST may be turned on. A reference voltage Vss may be applied to a selected source select line sel_SSL and an unselected source select line unsel_SSL. The reference voltage Vss may be a ground voltage.

At a second time t2, the pre-program voltage Vpre may be applied to a selected word line sel_WL and a word line n_unsel_WL adjacent to the selected word line sel_WL. For example, as pictured, a voltage of the selected word line sel_WL and the adjacent word line n_unsel_WL may reach the pass voltage Vpass and may then be increased to the pre-program voltage Vpre.

The adjacent word line n_unsel_WL may refer to a word line located relatively close to the selected word line sel_WL among unselected word lines, and may include one word line or a plurality of word lines. For example, the adjacent word line n_unsel_WL may be two word lines located at both sides of the selected word line sel_WL, respectively, and both sides may be arranged in a horizontal direction or a vertical direction. According to this example, the pre-program voltage Vpre may be applied to three word lines including the selected word line sel_WL. In another example, the adjacent word line n_unsel_WL may be a word line that is coupled to a memory cell on which a program operation is not performed yet or a word line that is coupled to a memory cell having an erase state among word lines located close to the selected word line sel_WL. On the assumption that a program operation is performed in order in which word lines are arranged or stacked, a word line located at one side of the selected word line sel_WL may be selected as the adjacent word line n_unsel_WL. According to this example, the pre-program voltage Vpre may be applied to two word lines including the selected word line sel_WL.

As a result, a strong fringe field may be generated between the selected word line sel_WL and the adjacent word line n_unsel_WL, thereby the hole of the space region may be removed.

The pass voltage Vpass may be applied to the unselected word line unsel_WL. In addition, voltages applied to the selected drain select line sel_DSL, an unselected drain select line unsel_DSL, the selected source select line sel_SSL, and the unselected source select line unsel_SSL, respectively, may be maintained.

At a third time t3, the selected word line sel_WL, the adjacent word line n_unsel_WL, and the unselected word line unsel_WL may be discharged.

At a fourth time t4, the reference voltage Vss may be applied to the selected drain select line sel_DSL and the drain select transistor DST may be turned off.

At a fifth time t5, the power voltage Vcc may be applied to the selected drain select line sel_DSL and the drain select transistor DST may be turned on. The reference voltage Vss may be applied to the selected source select line sel_SSL and the unselected source select line unsel_SSL. The reference voltage Vss may be a ground voltage.

At a sixth time t6, the program voltage Vpgm may be applied to the selected word line sel_WL. For example, as pictured, the voltage of the selected word line sel_WL may reach the pass voltage Vpass and may then be increased to the program voltage Vpgm. Thereby, the selected memory cells may be programmed.

The pass voltage Vpass may be applied to the adjacent word line n_unsel_WL and the unselected word line unsel_WL. In addition, the voltages applied to the selected drain select line sel_DSL, the unselected drain select line unsel_DSL, the selected source select line sel_SSL, and the unselected source select line unsel_SSL, respectively, may be maintained.

At a seventh time t7, the selected word line sel_WL, the adjacent word line n_unsel_WL, and the unselected word line unsel_WL may be discharged.

At an eighth time t8, the reference voltage Vss may be applied to the selected drain select line sel_DSL and the drain select transistor DST may be turned off.

According to the operating method as described above, the hole of the space region may be removed by performing the pre-program operation PRE-PGM before performing the program operation PGM. Accordingly, a charge loss due to the hole of the space region may be prevented and retention characteristics may be improved.

The pre-program voltage Vpre may have a lower level than the program voltage Vpgm. In some embodiments, the pre-program voltage Vpre may be 11 to 12V. The pre-program voltage Vpre may in some instances be applied fewer times than the program voltage Vpgm is applied. For example, the pre-program voltage Vpre may be applied as a single pulse, as opposed to multiple pulses. Accordingly, a memory cell coupled to the adjacent word line n_unsel_WL may be prevented from being programmed, or deterioration of disturb characteristics and a threshold voltage distribution may be mitigated or prevented when removing the hole.

Although a single program operation PGM is described, a plurality of program operations may be performed. For example, program operations may be performed by a shadow program method, a reprogram method, and the like. Accordingly, a second program voltage and the like may be applied to the selected word line sel_WL after the eighth time t8.

Figure 8A:
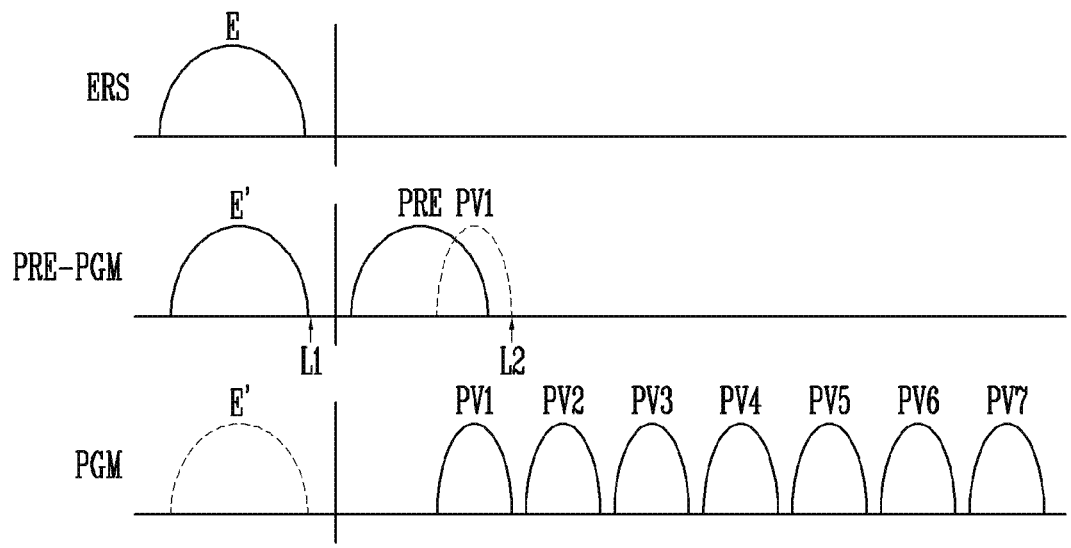
FIGS. 8A and 8B are diagrams illustrating a threshold voltage distribution according to a method of operating a semiconductor device, according to an embodiment.
Figure 8B:
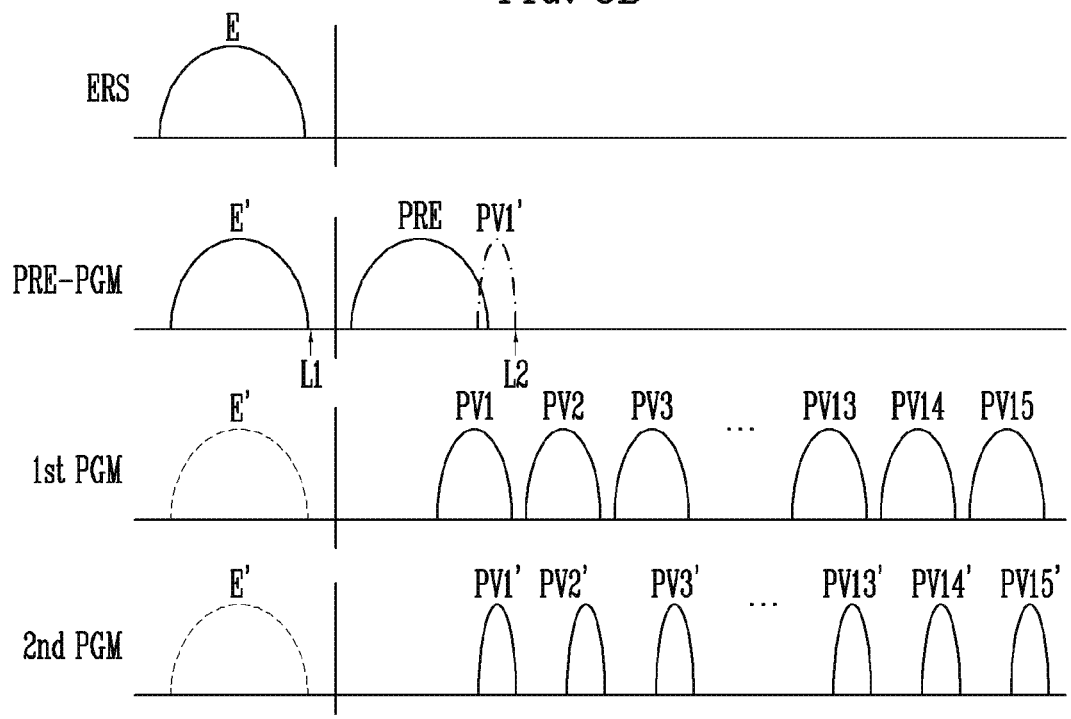

FIGS. 8A and 8B are diagrams illustrating a threshold voltage distribution according to a method of operating a semiconductor device, according to an embodiment. FIG. 8A illustrates a program operation performed by a TLC method. FIG. 8B illustrates a program operation performed by a QLC method.

Referring to FIG. 8A, memory cells included in a memory block on which an erase operation ERS is performed may have a distribution E. Subsequently, the hole of the space region may be removed by performing the pre-program operation PRE_PGM. For example, a pre-program voltage may be applied to a selected word line and an adjacent word line, and a pass voltage may be applied to the remaining unselected word lines. Thereby, memory cells coupled to the selected word line and the adjacent word line may have a distribution PRE. In addition, memory cells coupled to the remaining unselected word lines may have a distribution E'.

Conditions, such as a level of a pre-program voltage, a width of a voltage, the number of times a voltage is applied, or the number of adjacent word lines (the number of unselected word lines to which a pre-program voltage is applied), may be determined considering upper limits of the distribution E' and the distribution PRE. For example, a condition of the pre-program operation PRE_PGM may be determined such that an upper limit of the distribution E' may have a smaller value than a disturb limit level L1, and an upper limit of the distribution PRE may have a smaller value than an upper limit L2 of a first program distribution PV1. The disturb limit level L1 may be determined by considering reliability parameters, a margin, and the like.

Subsequently, the program operation PGM may be performed. For example, a program voltage may be applied to a selected word line and a pass voltage may be applied to unselected word lines. Thereby, the selected memory cells of the selected word line sel_WL may have eight distributions, that is, the distributions E' and PV1 to PV7. The program operation may be performed by a one-shot program method or may include a plurality of program operations.

Referring to FIG. 8B, memory cells included in a memory block on which the erase operation ERS is performed may have the distribution E. Subsequently, the hole of the space region may be removed by performing the pre-program operation PRE_PGM. Thereby, memory cells coupled to the selected word line and the adjacent word line may have the distribution PRE. In addition, memory cells coupled to the remaining unselected word lines may have the distribution E'. An upper limit of the distribution PRE should be smaller than the upper limit L2 of a final first program distribution PV1'.

Subsequently, a first program operation 1st PGM may be performed. Thereby, the selected memory cells of the selected word line sel_WL may have sixteen distributions, that is, the distributions E' and PV1 to PV15.

Subsequently, a second program operation 2nd PGM may be performed. The second program operation 2nd PGM may be to decrease widths of the program distributions PV1 to PV15. Although an example in which a final distribution is implemented by first and second program operations 1st PGM and 2nd PGM is described in this embodiment, three or more program operations may be performed in other embodiments.

According to the operating method as described above, the condition of the pre-program operation PRE_PGM may be adjusted considering threshold voltage variations due to the pre-program operation PRE-PGM. For example, a level of the pre-program voltage, a width of a voltage, and the number of times a voltage is applied may be determined. Thereby, deterioration of the threshold voltage may be lowered or minimized. In addition, a distribution width of a threshold voltage may be decreased by the second program operation 2nd PGM even when a threshold voltage distribution is deteriorated by the pre-program operation PRE_PGM.

FIG. 9 is a flowchart illustrating a method of operating a semiconductor device, according to an embodiment. Hereinafter, repetitive descriptions of components already described above are omitted.

First, a diameter of a channel layer of a selected memory cell and a reference value may be compared to each other at step S910. Subsequently, a level of a pre-program voltage may be adjusted according to the diameter of the channel layer. When the diameter of the channel layer is the same as the reference value, a pre-program operation may be performed maintaining a predetermined level of the pre-program voltage. When the diameter of the channel layer is greater than the reference value, the level of the pre-program voltage may be increased at step S920. When the diameter of the channel layer is less than the reference value, the level of the pre-program voltage may be decreased at step S930. Subsequently, the adjusted pre-program voltage may be applied to the selected word line and the adjacent word line at step S940. Subsequently, a program voltage may be applied to the selected word line at step S950.

For example, when the diameter of the channel layer is the same as the reference value, a pre-program voltage of 11 to 12V may be applied to the selected word line and the adjacent word line. When the diameter of the channel layer is greater than the reference value, a level of the pre-program voltage may be increased by 1 to 2V. When the diameter of the channel layer is smaller than the reference value, a level of the pre-program voltage may be decreased by 1 to 2V.

The memory cells may be grouped according to the diameter of the channel layer. Accordingly, a pre-program operation may be performed on memory cells included in the same group by using the same level of pre-program voltage. In addition, difference in level of the pre-program voltage of 1 to 2V may exist between groups.

Figure 10A:
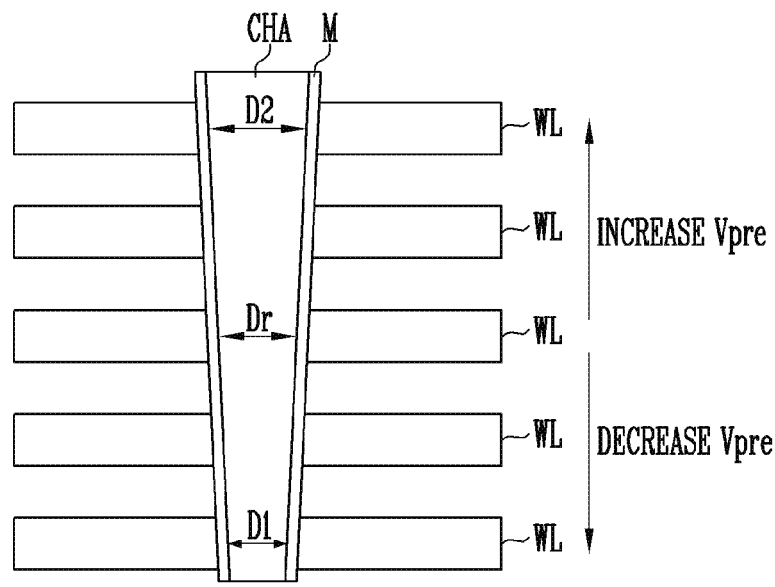
Figure 10B:
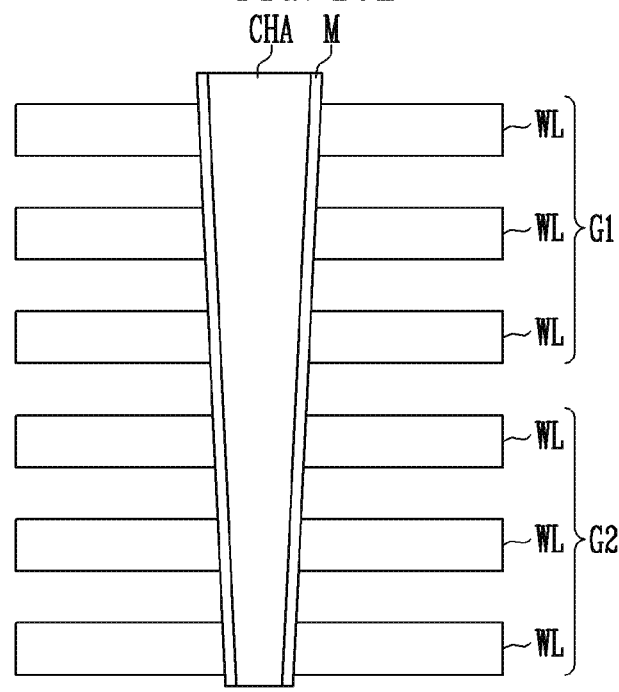

FIGS. 10A to 10C are mimetic diagrams illustrating a method of adjusting a pre-program voltage, according to an embodiment.

Referring to FIGS. 10A to 10C, the plurality of word lines WL may be stacked. The word lines WL may include a conductive material such as polysilicon or tungsten. In addition, the word lines WL and insulating layers (not illustrated) may be alternately stacked on each other.

The channel layer CHA may pass through the plurality of word lines WL, and memory cells may be located at intersections of the channel layer CHA and the word lines WL. Accordingly, the plurality of memory cells may be stacked along the channel layer CHA.

In addition, the memory layer M may be interposed between the channel layer CHA and the word lines WL. The memory layer M may enclose a sidewall of the channel layer CHA. Accordingly, the stacked memory cells may share the memory layer M. In addition, the memory layer M may include a corresponding space region between the stacked word lines WL.

A manufacturing method is described briefly as below. First, a stacked structure including first material layers and second material layers that are alternately stacked on each other may be formed and then an opening that passes through the stacked structure may be formed. Subsequently, the memory layer M and the channel layer CHA may be formed in the opening. A central region of the channel layer CHA may be opened or completely filled. When the central region of the channel layer CHA is opened, the central region may be filled with a gap-fill layer. Subsequently, the first material layers may be replaced with third material layers (for example, a metal layer, a silicide layer, or an insulating layer). For example, the first material layers including a sacrificial material such as a nitride may be replaced with the third material layers including metal. The third material layers may be the word lines WL.

However, according to this manufacturing method, because the opening is formed by an etching process, a width of the opening may decrease from an upper portion towards a lower portion of the opening due to a limitation of an etching process. Accordingly, a diameter of the channel layer CHA formed in the opening may also decrease from an upper portion towards a lower portion of the channel layer CHA. When a memory cell has a gate-all-around (GAA) structure in which a gate electrode encloses a sidewall of a channel layer, the memory cell may have different characteristics according to change in diameter of the channel layer CHA. Accordingly, the condition of the pre-program operation may be adjusted according to the diameter of the channel layer CHA to effectively remove the hole of the space region.

Referring to FIG. 10A, a diameter of the channel layer CHA may vary depending on a level. Accordingly, a pre-program condition may be adjusted according to the diameter of the channel layer CHA. For example, when a diameter D1 of the channel layer CHA is smaller than a reference value Dr, a level of the pre-program voltage may be decreased, and when a diameter D2 of the channel layer CHA is greater than the reference value Dr, the level of the pre-program voltage may be increased.

In addition, the channel layer CHA may have a diameter which increases towards the upper portion of the channel layer CHA and decreases towards the lower portion of the channel layer CHA. Accordingly, a condition of the pre-program voltage may be adjusted according to the level of the word line. For example, when a word line located in a relatively upper level is selected, a pre-program voltage of a relatively high level may be used when compared to a case in which a word line located in a relatively lower level is selected.

Referring to FIG. 10B, the word lines WL may be grouped according to a diameter of the channel layer CHA, and a pre-program condition may be adjusted according to a group. For example, the word lines WL located in levels where the channel layer CHA has a relatively large diameter may be grouped into a first group G1 and the word lines WL located in levels where the channel layer CHA has a relatively small diameter may be grouped into a second group G2. When a word line included in the first group G1 is selected, a pre-program voltage of a relatively high level may be used when compared to a case in which a word line included in the second group G2 is selected. The number of groups and the number of word lines WL included in a group may be different for different embodiments.

Referring to FIG. 10C, the channel layer CHA may include a plurality of pillars P1 and P2 with independently tapered cross sections. Each of the pillars P1 and P2 may have a width which decreases from an upper portion towards a lower portion. At a portion where the upper pillar P1 and the lower pillar P2 are coupled, a lower end of the upper pillar P1 may have a smaller width than an upper end of the lower pillar P2. Accordingly, a condition of a pre-program may be adjusted by comparing a diameter of the channel layer CHA to the reference value Dr at each of the pillars P1 and P2.

Although structures in which the central region of the channel layer CHA is completely filled are illustrated in FIGS. 10A to 10C, the channel layer CHA may be filled with a gap-fill layer. Furthermore, although a structure in which the upper pillar P1 and the lower pillar P2 are coupled in a single layer is illustrated in FIG. 10C, the upper pillar P1 and the lower pillar P2 may be included in separate layers, respectively, and an interface or a pad may be present between the upper pillar P1 and the lower pillar P2.

Figure 11:
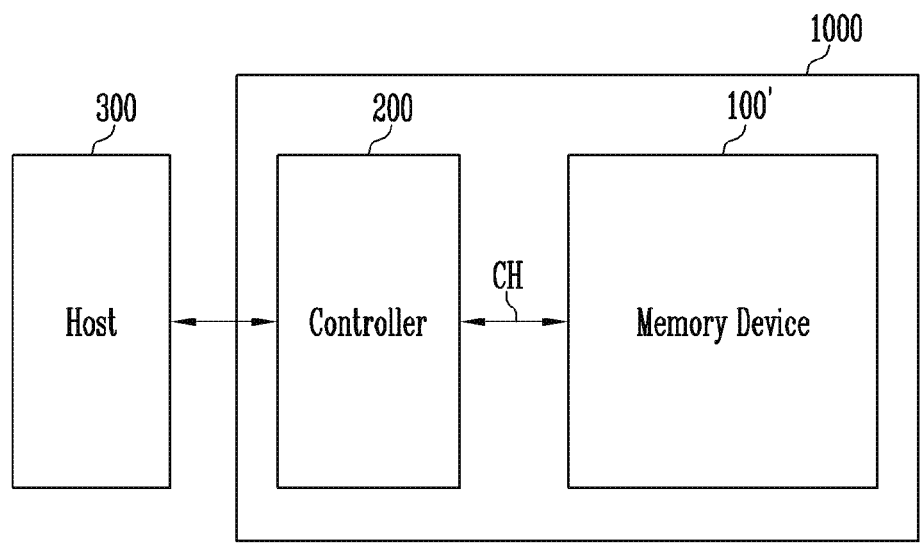
FIG. 11 is a block diagram illustrating a configuration of a memory system, according to an embodiment.

FIG. 11 is a block diagram illustrating the configuration of a memory system 1000 according to an embodiment. Referring to FIG. 11, the memory system 1000 may include a memory device 100' and a controller 200.

The controller 200 may control the memory device 100' through a channel CH, and the memory device 100' may operate in response to control of the controller 200. The memory device 100' may include a memory cell array including a plurality of memory blocks. According to an embodiment, the memory device 100' may be the semiconductor device 100 described above, or flash memory device.

The controller 200 may control the memory device 100' in response to a request from a host 300. In addition, the memory device 100' may receive a command and an address from the controller 200 through the channel CH and access an area selected from the memory cell array in response to the address. In other words, the memory device 100' may perform an internal operation corresponding to a command on the area selected by the address.

In addition, the controller 200 may control the memory device 100' to perform a program operation, a read operation, or an erase operation. During the program operation, the controller 200 may provide a program command, an address, data, and the like to the memory device 100' through the channel CH, and the memory device 100' may program the area selected by the address with data. During the erase operation, the controller 200 may provide an erase command, an address, and the like to the memory device 100' through the channel CH, and the memory device 100' may erase data stored in the area selected by the address. During the read operation, the controller 200 may provide a read command, an address, and the like to the memory device 100' through the channel CH and the memory device 100' may read data from an area selected by the address. This read operation may include a read operation serving as verification entailed by a program or erase operation as well as a read operation performed to read and output data stored in a memory cell.

When the controller 200 receives a program operation requested from the host 300, the controller 200 may command that the memory device 100' may perform the program operation by the method described above with reference to FIGS. 5 to 10C. In other words, a program voltage may be applied to a selected word line after removing a hole of a space region by applying a pre-program voltage to the selected word line and an adjacent word line. According to this method, because the hole of the space region is removed before the program operation, the reliability of data programmed to the memory cells may be improved.

Figure 12:
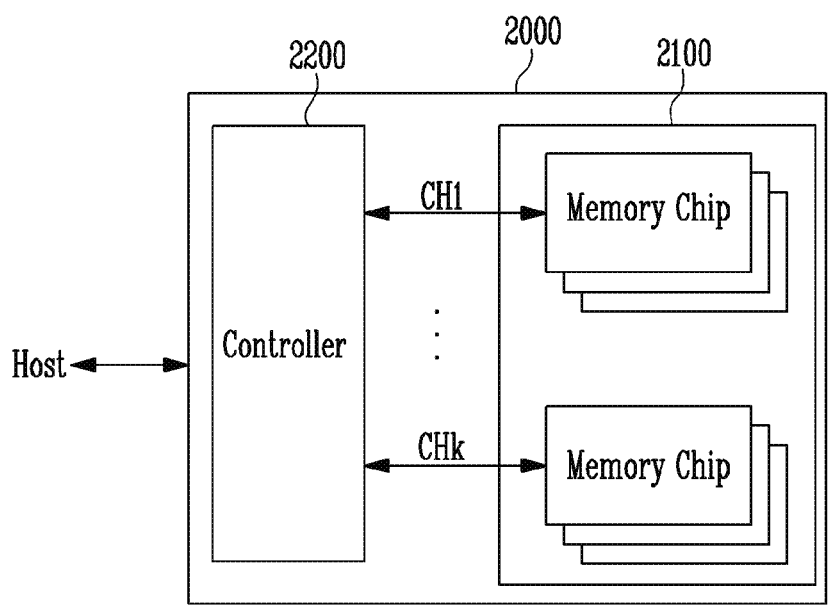
FIG. 12 is a block diagram illustrating a configuration of a memory system, according to an embodiment.

FIG. 12 is a block diagram illustrating the configuration of a memory system 2000, according to an embodiment. Referring to FIG. 12, the memory system 2000 may include a memory device 2100 and a controller 2200.

The memory device 2100 may be a semiconductor device and include a plurality of memory chips. The plurality of memory chips may be divided into a plurality of groups. The plurality of groups may communicate with the controller 2200 through first to kth channels CH1 to CHk, respectively. Each of the memory chips may be configured and operated in a similar manner as the semiconductor device 100 described above with reference to FIG. 1.

Each group may be configured to communicate with the controller 2200 through a single common channel. The controller 2200 may be configured in substantially the same manner as the controller 200 described with reference to FIG. 11, and configured to control the plurality of memory chips of the memory device 2100 through the plurality of channels CH1 to CHk. The memory system 2000 may be modified so that a single memory chip may be coupled to a single channel.

The controller 2200 and the memory device 2100 may be integrated into one semiconductor device. According to an embodiment, the controller 2200 and the memory device 2100 may be integrated into a single semiconductor device to form a memory card. For example, the controller 2200 and the memory device 2100 may be integrated into a single semiconductor device and form a memory card such as a personal computer memory card international association (PCMCIA), a compact flash card (CF), a smart media card (SM or SMC), a memory stick, a multimedia card (MMC, RS-MMC, or MMCmicro), an SD card (SD, miniSD, microSD, or SDHC), and a universal flash storage (UFS).

The controller 2200 and the memory device 2100 may be integrated into a single semiconductor device to form a Solid State Drive (SSD). The SSD may include a storage device for storing data in a memory. When the memory system 2000 serves as an SSD, operational rates of the host Host coupled to the memory system 2000 may be significantly improved.

In another example, the memory system 2000 may be provided as one of various elements of an electronic device such as a computer, an Ultra Mobile PC (UMPC), a workstation, a net-book, Personal Digital Assistants (PDAs), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, or one of various elements for forming a computing system.

Figure 13:
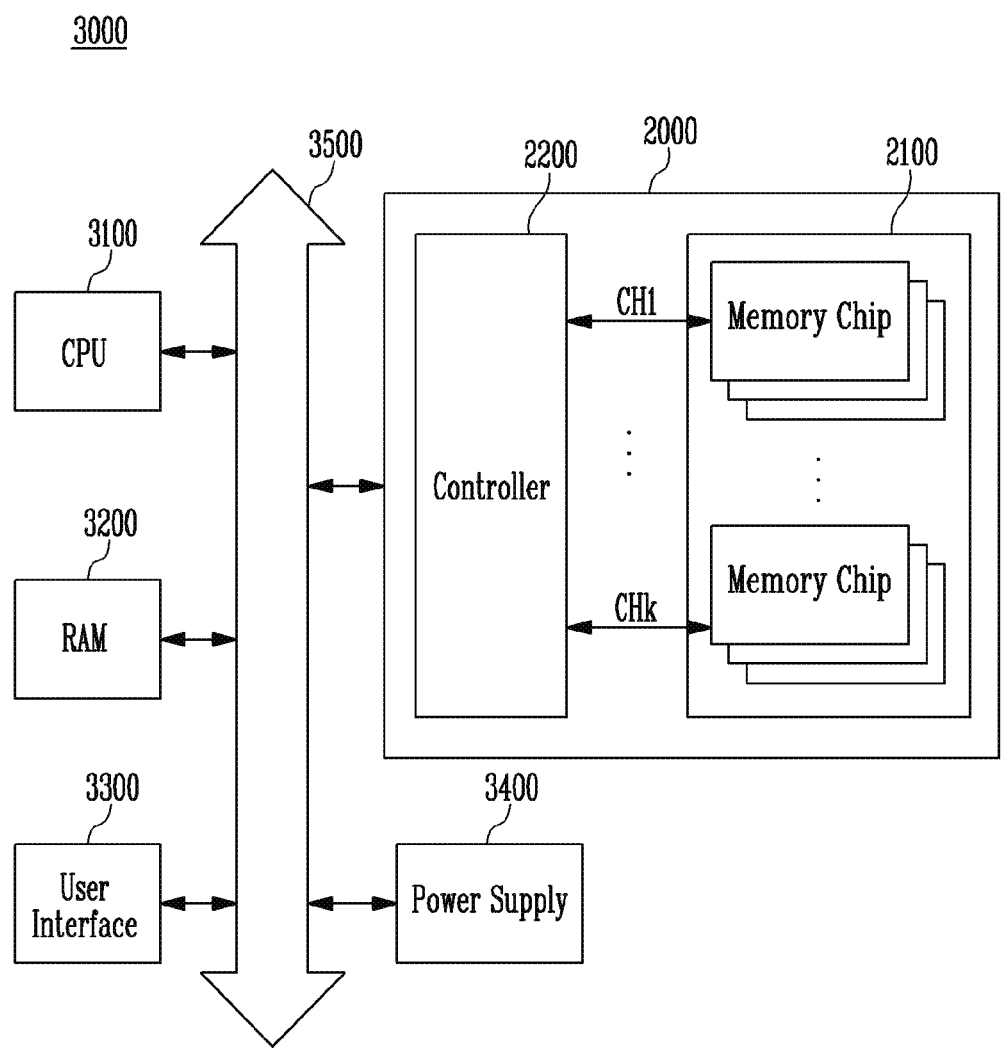
FIG. 13 is a block diagram illustrating a configuration of a computing system, according to an embodiment.

FIG. 13 is a block diagram illustrating the configuration of a computing system 3000 according to an embodiment. Referring to FIG. 13, the computing system 3000 may include a central processing unit 3100, Random Access Memory (RAM) 3200, a user interface 3300, a power supply 3400, a system bus 3500, and the memory system 2000.

The memory system 2000 may be electrically connected to the central processing unit 3100, the RAM 3200, the user interface 3300, and the power supply 3400 through the system bus 3500. Data provided through the user interface 3300 or data processed by the central processing unit 3100 may be stored in the memory system 2000.

The memory device 2100 may be coupled to the system bus 3500 through the controller 2200, or directly coupled to the system bus 3500. When the memory device 2100 is directly coupled to the system bus 3500, functions of the controller 2200 may be performed by the central processing unit 3100 and the RAM 3200.

The computing system 3000 may include the memory system 2000 described with reference to FIG. 12 or the memory system 1000 described with reference to FIG. 11. In addition, the computing system 3000 may include both of the memory systems 1000 and 2000 described above with reference to FIGS. 11 and 12.

According to embodiments, a semiconductor device having improved operational characteristics and reliability and an operating method of the semiconductor device may be provided.

Examples of embodiments have been disclosed herein, and although specific terms are employed, various changes in form and detail may be made to the above-described examples of embodiments without departing from the spirit and scope of the present teachings. Accordingly, it will be understood by those skilled in the art that the scope of the present teachings should not be limited to the above-described examples of embodiments, and may cover the scope of the following claims and their equivalents.

What is claimed is:

1. A method of operating a semiconductor device, wherein the semiconductor device comprises at least one string including a plurality of memory cells and being coupled between a common source line and a bit line, the method comprising:
    applying a pre-program voltage to a selected word line coupled to a selected memory cell among the plurality of memory cells;
    applying the pre-program voltage to an unselected word line coupled to an unselected memory cell adjacent to the selected memory cell;
    applying a pass voltage to remaining unselected word lines, wherein a level of the pass voltage is lower than a level of the pre-program voltage; and
    applying a first program voltage to the selected word line.

2. The method of claim 1, wherein the pre-program voltage is applied to an nth word line which is selected and to an (n−1)th word line and an (n+1)th word line which are located at both sides of the nth word line, respectively, and n is an integer of 1 or more.

3. The method of claim 1, wherein the pre-program voltage is applied to an nth word line which is selected and to an (n+1)th word line which is located at one side of the nth word line, and n is an integer of 1 or more.

4. The method of claim 3, wherein a memory cell coupled to the (n+1)th word line is in an erase state.

5. The method of claim 1, wherein the selected memory cell and the unselected memory cell share a memory layer, the memory layer includes a space region located between the selected memory cell and the unselected memory cell, and a charge is injected into the space region when the pre-program voltage is applied.

6. The method of claim 5, wherein the charge is injected into the space region by a fringe field generated by the pre-program voltage.

7. The method of claim 5, wherein a hole of the space region is removed by the charge.

8. The method of claim 1, wherein the pre-program voltage induces a fringe field between the selected memory cell and the unselected memory cell.

9. The method of claim 1, wherein the pre-program voltage has a lower level than the first program voltage.

10. The method of claim 1, further comprising applying a second program voltage, after applying the first program voltage, to decrease a width of a distribution formed by the first program voltage.

11. The method of claim 1, wherein a level of the pre-program voltage is adjusted according to a diameter of a channel layer of the selected memory cell.

12. A semiconductor device comprising:
    a memory string coupled between a common source line and a bit line, wherein the memory string comprises a plurality of memory cells;
    a plurality of word lines coupled to the plurality of memory cells, respectively; and
    a control logic configured to apply a pre-program voltage to a selected word line among the plurality of word lines and to a first unselected word line adjacent to the selected word line, to apply a pass voltage having a lower level than the pre-program voltage to a second unselected word line away from the selected word line than the first unselected word line, and then to apply a program voltage to the selected word line.

13. The semiconductor device of claim 12, wherein the control logic is configured to apply the pre-program voltage to an nth word line which is selected and to an (n−1)th word line and an (n+1)th word line which are located at both sides of the nth word line, respectively, and n is an integer of 1 or more.

14. The semiconductor device of claim 12, wherein the control logic is configured to apply the pre-program voltage to the selected word line and to an unselected word line adjacent to the selected word line, wherein the unselected word line is coupled to a memory cell in an erase state.

15. The semiconductor device of claim 12, wherein a selected memory cell and an unselected memory cell of the plurality of memory cells share a memory layer, the memory layer includes a space region located between the selected memory cell and the unselected memory cell, and a charge is injected into the space region by a fringe field generated by the pre-program voltage.

16. A semiconductor device comprising:
    stacked word lines;
    a channel layer passing through the stacked word lines; and
    a memory layer enclosing the channel layer,
    wherein the semiconductor device is configured to apply a pre-program voltage to a selected word line and to an unselected word line adjacent to the selected word line, to apply a pass voltage having a lower level than the pre-program voltage to remaining unselected word lines, and then to apply a program voltage to the selected word line.

17. The semiconductor device of claim 16, wherein the semiconductor device is configured to apply the pre-program voltage to an nth word line which is selected and to an (n−1)th word line and an (n+1)th word line which are located at both sides of the nth word line, respectively, and n is an integer of 1 or more.

18. The semiconductor device of claim 16, wherein the semiconductor device is configured to apply the pre-program voltage to the selected word line and to an unselected word line adjacent to the selected word line, wherein the unselected word line is coupled to a memory cell in an erase state.

19. The semiconductor device of claim 16, wherein the memory layer includes a space region located between the selected word line and the unselected word line, wherein the semiconductor device is configured to inject a charge into the space region using a fringe field generated by the pre-program voltage.

20. The semiconductor device of claim 16, wherein the channel layer has a diameter which changes with level, wherein the semiconductor device is configured to increase a level of the pre-program voltage applied to a corresponding word line when the corresponding word line is associated with an increase in diameter for the channel layer.

* * * * *